(12) United States Patent
Takagi et al.

(10) Patent No.: US 10,996,569 B2
(45) Date of Patent: May 4, 2021

(54) MEASUREMENT DEVICE, METHOD AND DISPLAY DEVICE

(71) Applicant: HITACHI HIGH-TECH CORPORATION, Tokyo (JP)

(72) Inventors: Yuji Takagi, Tokyo (JP); Fumihiko Fukunaga, Tokyo (JP); Yasunori Goto, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 119 days.

(21) Appl. No.: 16/070,708

(22) PCT Filed: Jan. 27, 2016

(86) PCT No.: PCT/JP2016/052225
§ 371 (c)(1),
(2) Date: Jul. 17, 2018

(87) PCT Pub. No.: WO2017/130304
PCT Pub. Date: Aug. 3, 2017

(65) Prior Publication Data
US 2019/0033728 A1    Jan. 31, 2019

(51) Int. Cl.
*G06K 9/00* (2006.01)
*G03F 7/20* (2006.01)
(Continued)

(52) U.S. Cl.
CPC ....... *G03F 7/70633* (2013.01); *G06K 9/6255* (2013.01); *G06T 7/001* (2013.01);
(Continued)

(58) Field of Classification Search
CPC ............ G03F 7/70633; G03F 7/70625; G06K 9/6255; G06K 9/6254; G06K 9/6203;
(Continued)

(56) References Cited

U.S. PATENT DOCUMENTS

2007/0273858 A1* 11/2007 Nagasaka ........... G03F 7/70208
355/67
2009/0202139 A1* 8/2009 Toyoda .................... G06K 9/00
382/145
(Continued)

FOREIGN PATENT DOCUMENTS

| JP | 2009-194051 A | 8/2009 |
|---|---|---|
| JP | 2013-168595 A | 8/2013 |
| KR | 20130135095 A | 12/2013 |

OTHER PUBLICATIONS

Office Action dated Jul. 1, 2020 in Korean Application No. 10-2018-7016965.

*Primary Examiner* — Amara Abdi
(74) *Attorney, Agent, or Firm* — Miles & Stockbridge, P.C.

(57) ABSTRACT

An overlay measurement method using a reference image is an effective method for an overlay measurement in a product circuit. However, there is a problem that it is not possible to obtain an ideal reference image in a process of prototyping. A measurement device described in a specific embodiment of the present invention includes an imaging unit that captures an image of a circuit pattern of a semiconductor wafer surface by an optical microscope or an electronic microscope, a pattern recognition unit that extracts a first pattern and a second pattern from the image captured by the imaging unit, a reference image generation unit that synthesizes a first reference image using the first pattern extracted from a plurality of the images and synthesizes a second reference image using the second pattern extracted from the plurality of images, a quantification unit that quantifies a first difference that is a difference between the first reference image and the first pattern and a second difference that is a difference between the second reference image and the second pattern, and a calculation unit that calculates an
(Continued)

overlay amount included in the circuit pattern using the first difference and the second difference.

14 Claims, 11 Drawing Sheets

(51) Int. Cl.
    *H01J 37/22*     (2006.01)
    *G06K 9/62*     (2006.01)
    *G06T 7/00*     (2017.01)
    *H01L 23/544*     (2006.01)

(52) U.S. Cl.
    CPC ............ *H01J 37/22* (2013.01); *H01L 23/544* (2013.01); *G06T 2200/24* (2013.01); *G06T 2207/10061* (2013.01); *G06T 2207/30148* (2013.01)

(58) Field of Classification Search
    CPC ...... G06K 2209/19; G06T 2207/30148; G06T 2207/10061; G06T 2200/24; G06T 7/001; H01J 2237/2817; H01J 2237/221; H01J 37/28; H01J 37/244; H01J 37/22; H01L 23/544
    See application file for complete search history.

(56) References Cited

U.S. PATENT DOCUMENTS

| | | | |
|---|---|---|---|
| 2010/0074516 A1* | 3/2010 | Kawaragi | ............... G06T 7/001 382/149 |
| 2013/0010100 A1* | 1/2013 | Kotaki | ................... G01B 15/04 348/80 |
| 2013/0321811 A1 | 12/2013 | Maeda et al. | |
| 2014/0375793 A1* | 12/2014 | Harada | ............... G03F 7/70633 348/80 |
| 2016/0341947 A1* | 11/2016 | Sato | ..................... G02B 21/086 |

\* cited by examiner

[FIG. 1]
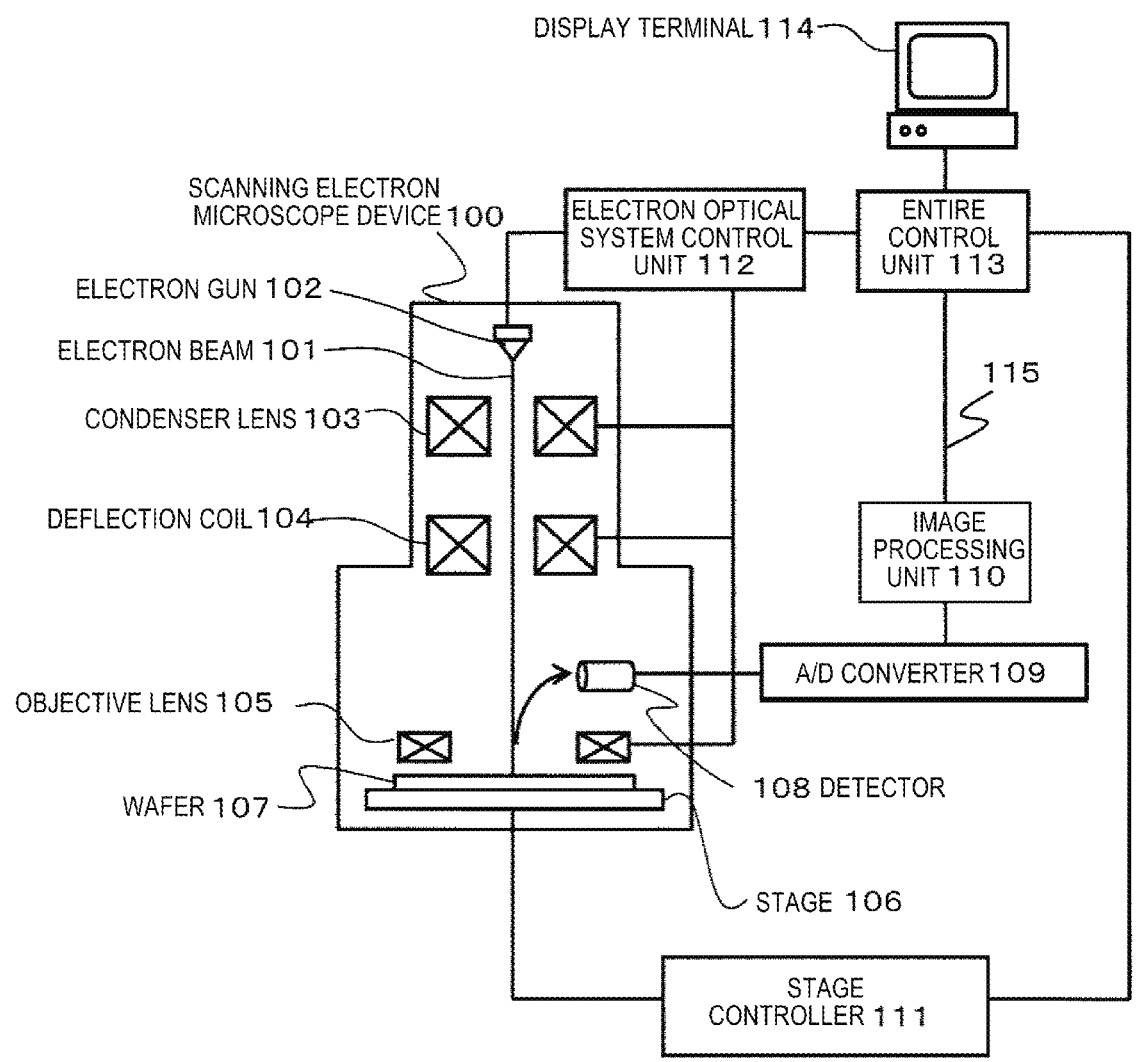

[FIG. 2]
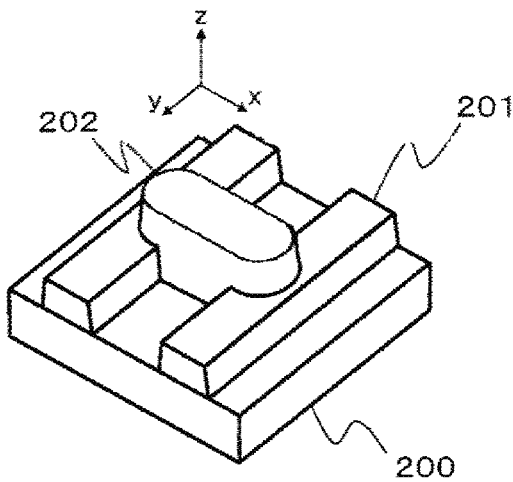
[FIG. 3]
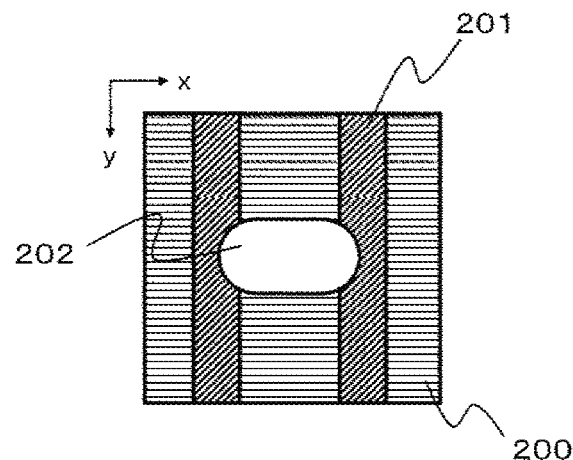
[FIG. 4]
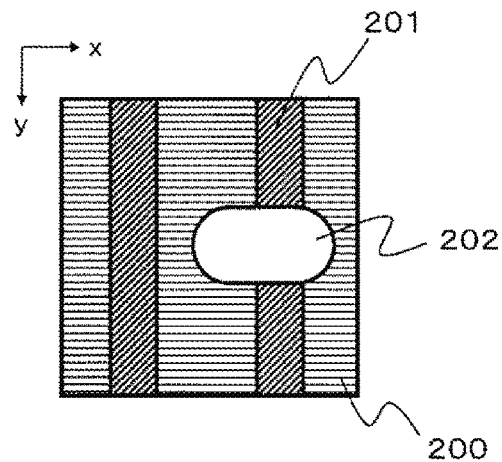

[FIG. 5]
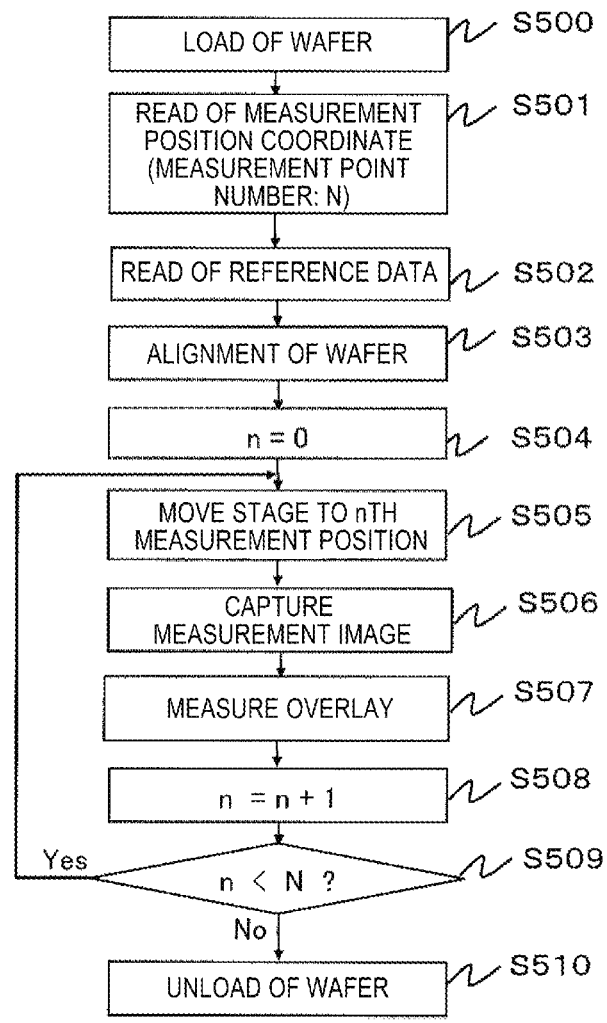

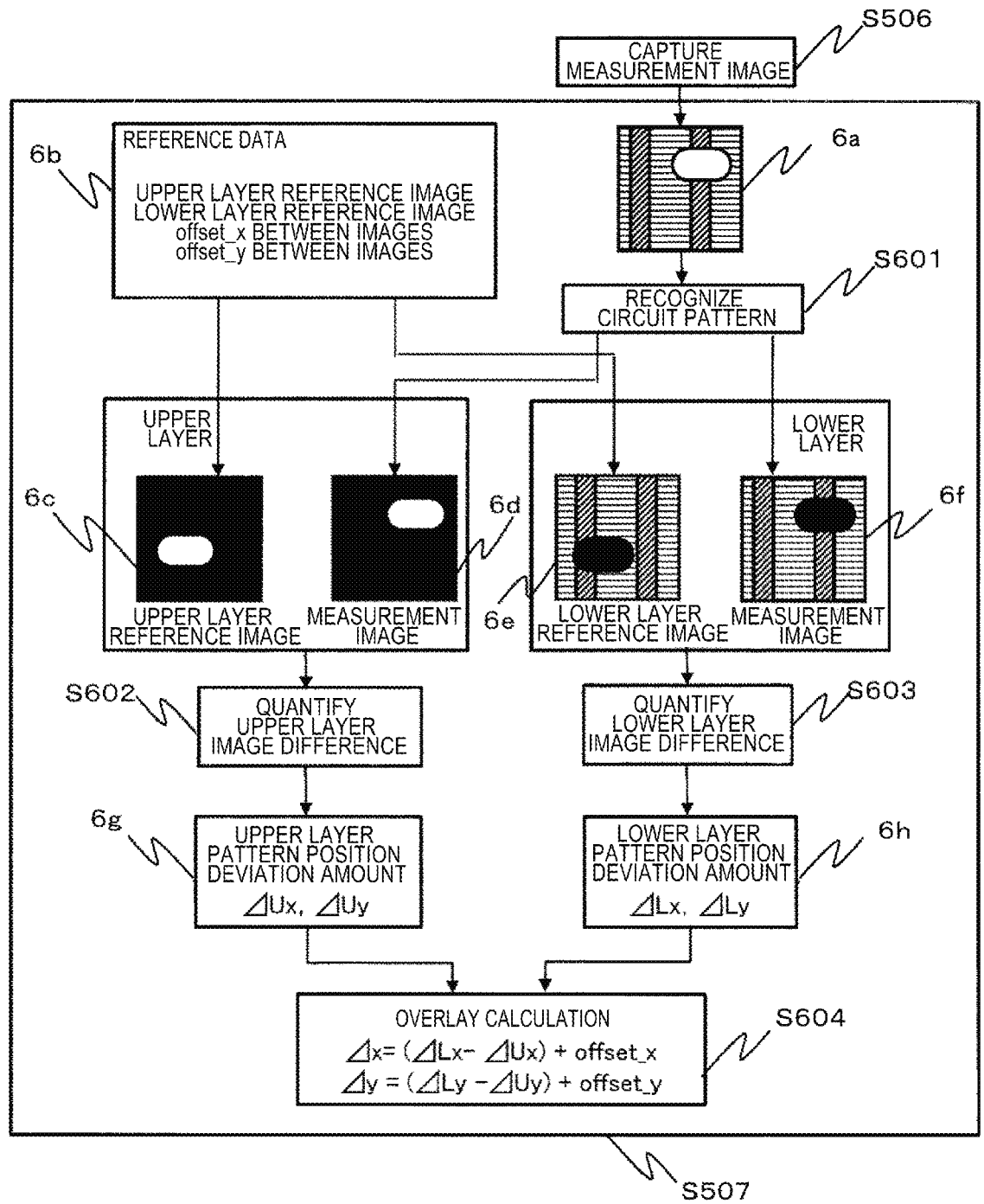

[FIG. 7]
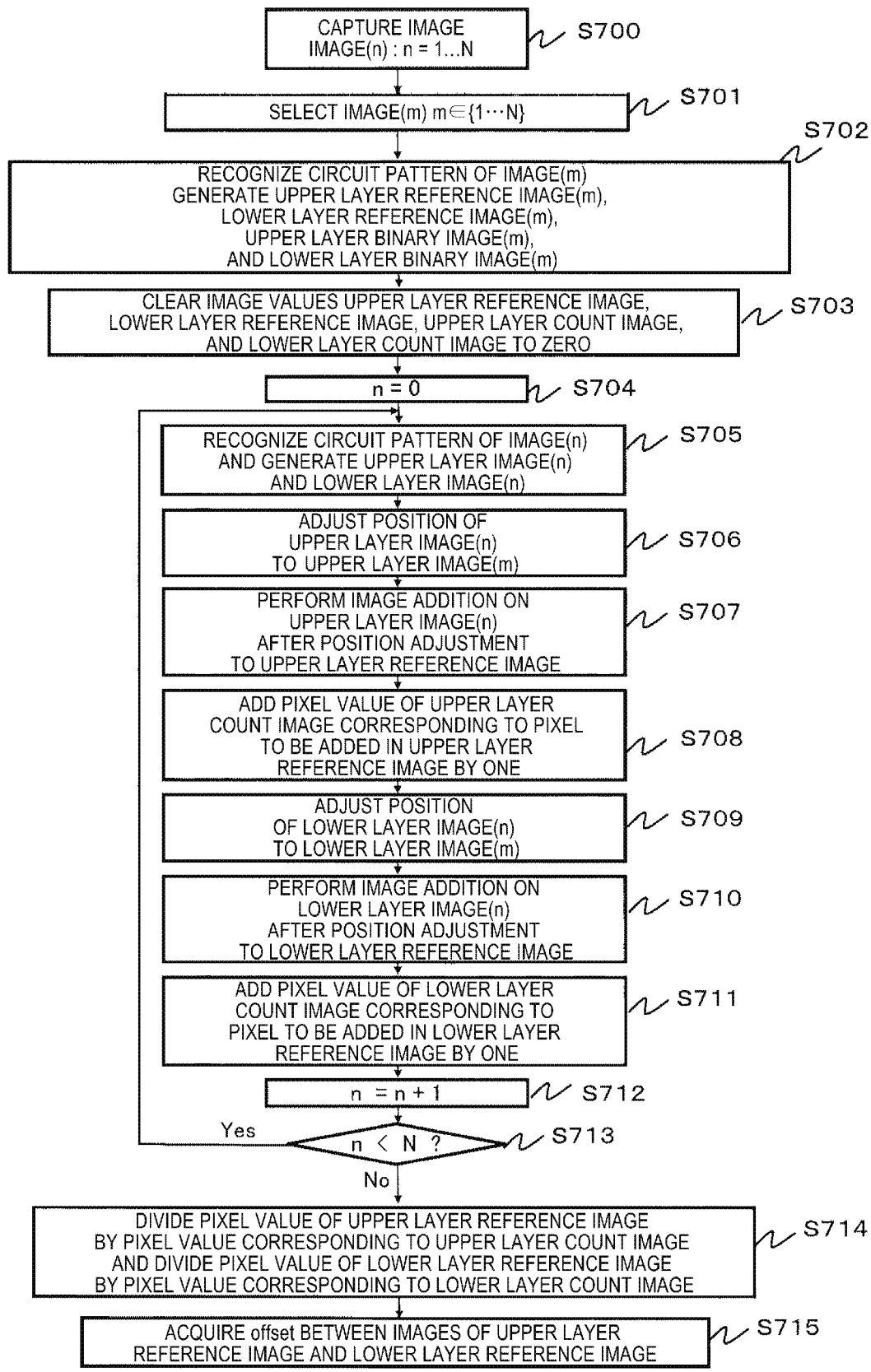

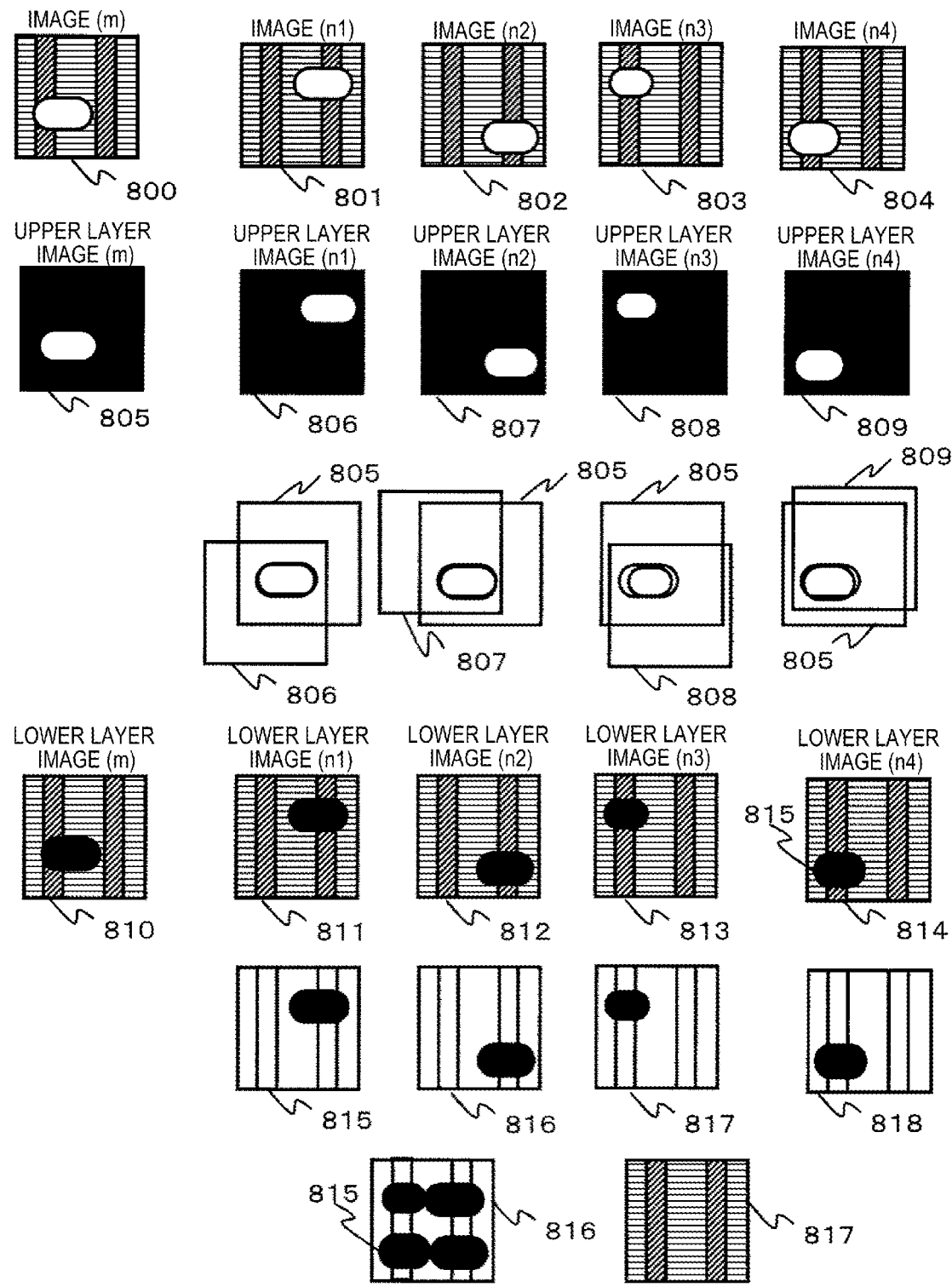
[FIG. 8]

[FIG. 9]
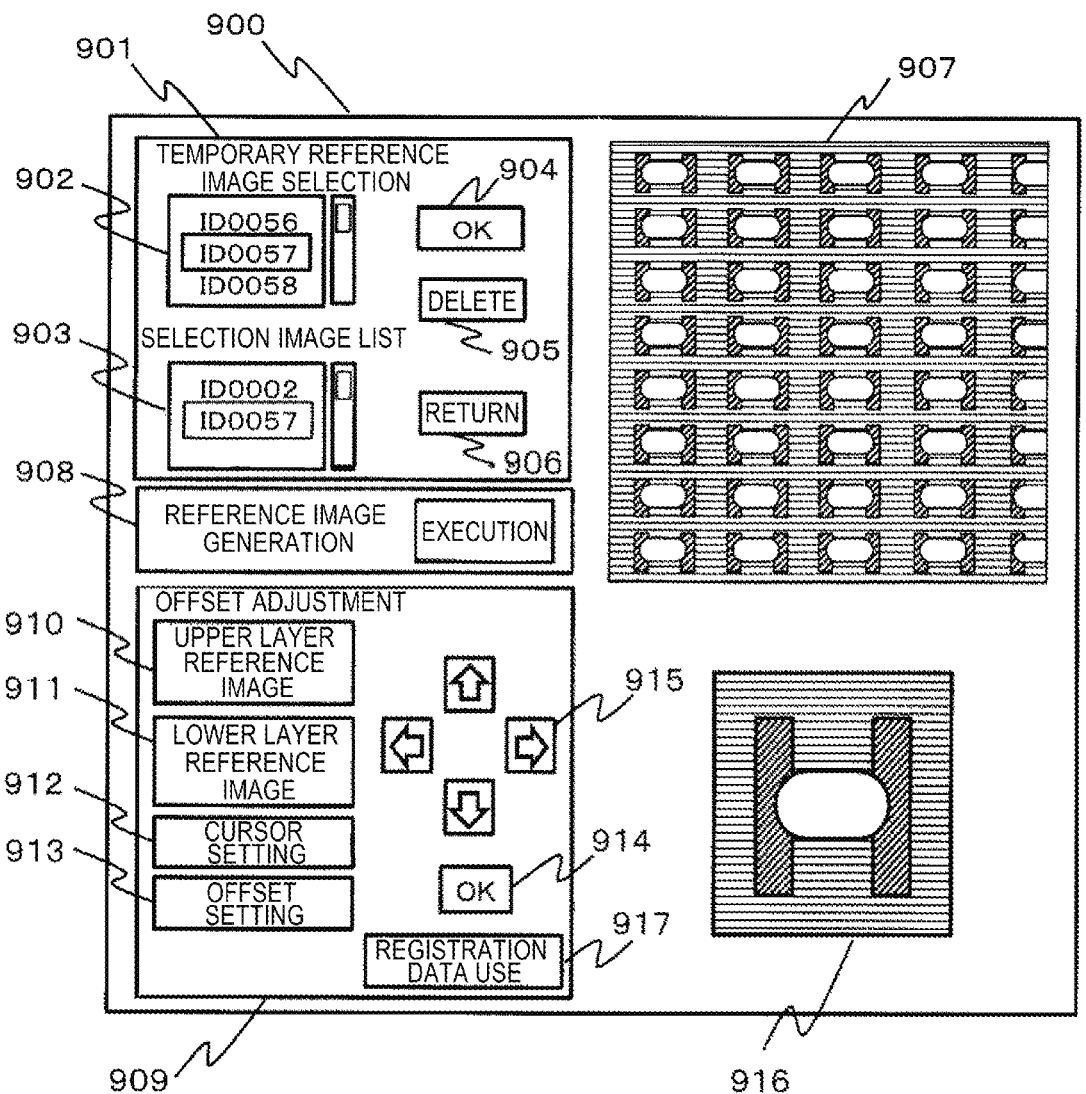
[FIG. 10]
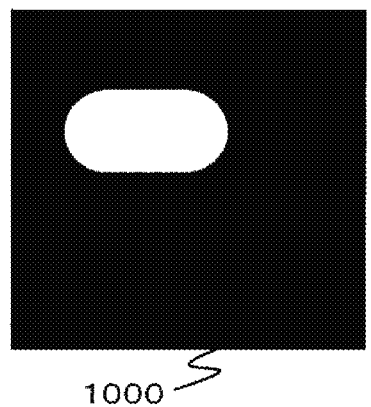

[FIG. 11]
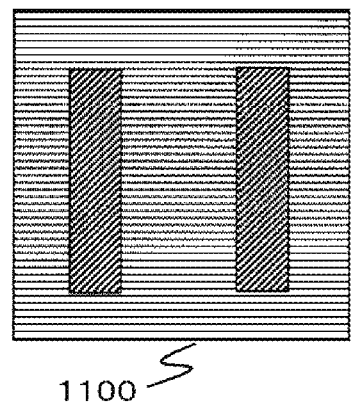
1100
[FIG. 12]
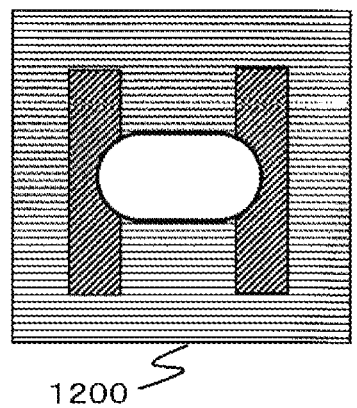
1200
[FIG. 13]
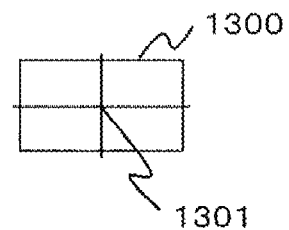
1300
1301

[FIG. 14]
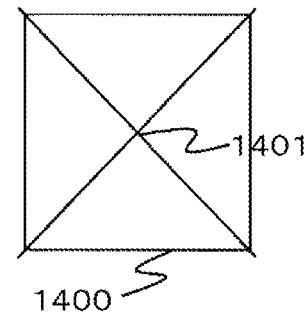
[FIG. 15]
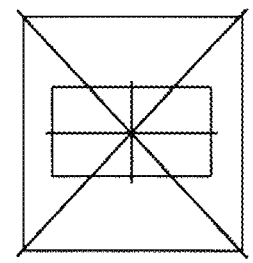
[FIG. 16]
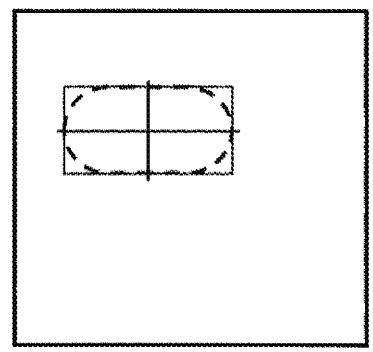
[FIG. 17]
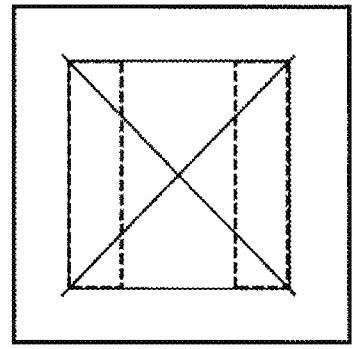

[FIG 18]
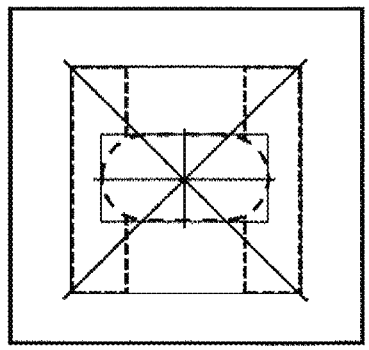
[FIG 19]
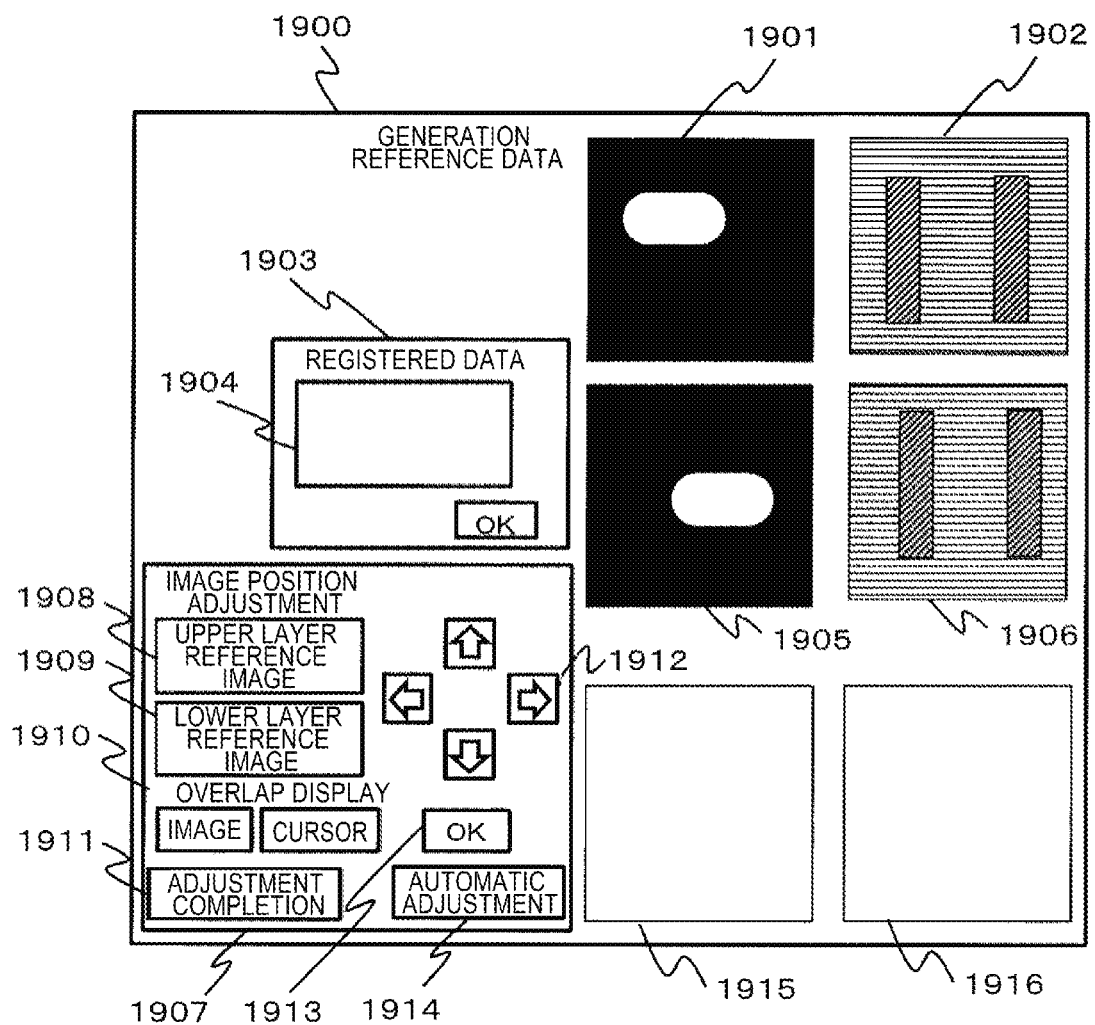

[FIG. 20]
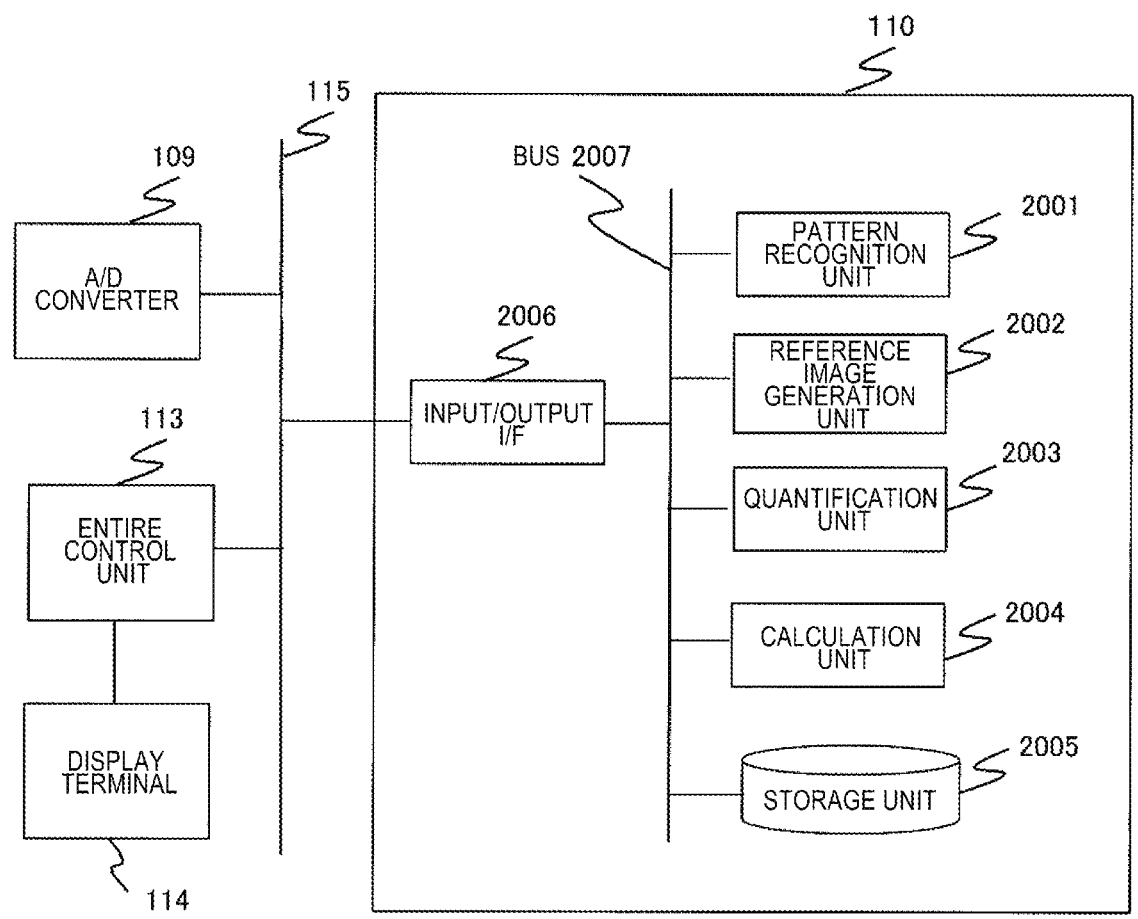

MEASUREMENT DEVICE, METHOD AND DISPLAY DEVICE

TECHNICAL FIELD

The present invention relates to a device, a method, and a display device for measuring an overlay occurring during the manufacture of a semiconductor wafer.

BACKGROUND ART

Generally, a semiconductor product requires plural times of exposure processes to form a circuit pattern necessary for an operation. For example, in the manufacture of the semiconductor product configured of circuit patterns of plural layers, in addition to an exposure process for forming the circuit pattern of each layer, an exposure process for forming a hole connecting each layer is necessary.

In the semiconductor manufacture, it is important to adjust a position of the circuit pattern formed by the plural times of the exposure processes within an allowable range. In a case where the position of the circuit pattern is not within the allowable range, an appropriate electrical characteristic is not obtained and a yield is reduced. Therefore, a differential (an overlay) of the circuit pattern between the exposures is measured and fed back to an exposure device.

In an overlay measurement of the related art, a dedicated mark provided around a chip is optically measured and an overlay measurement result inside the chip is obtained by an interpolation thereof. However, according to a miniaturization of a semiconductor process, the allowable range of the overlay is also reducing, and a necessity of directly measuring the overlay measurement at an arbitrary position of the product circuit pattern of the device is increasing.

PTL 1 discloses a method in which a reference image of a measurement place is captured in advance, a circuit pattern formed in each layer is recognized for both of the measurement images captured for the measurement, a position deviation amount of the reference image and the measurement images with respect to each pattern are independently measured, and the overlay is calculated from a difference of the calculated position deviation amount.

CITATION LIST

Patent Literature

PTL 1: JP-A-2013-168595

SUMMARY OF INVENTION

Technical Problem

The method of measuring the overlay using the reference image is an effective method for the overlay measurement in the product circuit. However, in a process of prototyping, there is a step of a process initial step in which there is a variation in quality of the overlay or the pattern. Even in such a case, it is not always possible to obtain an ideal reference image. There is a further problem that the overlay is desired to be calculated even in a case where the ideal reference image is not able to be obtained as described above.

The present invention enables an overlay measurement method using a reference image to calculate an overlay even without an appropriate reference image.

Solution to Problem

In order to solve the above-described problems, for example, the configuration described in the claims is adopted, but as an example thereof, a measurement device includes an imaging unit that captures an image of a circuit pattern of a surface of an inspection object by an optical microscope or an electronic microscope, a pattern recognition unit that extracts a first pattern and a second pattern from the image captured by the imaging unit, a reference image generation unit that synthesizes a first reference image using the first pattern extracted from a plurality of the images and synthesizes a second reference image using the second pattern extracted from the plurality of images, a quantification unit that quantifies a first difference that is a difference between the first reference image and the first pattern and a second difference that is a difference between the second reference image and the second pattern, and a calculation unit that calculates an offset amount included in the circuit pattern using the first difference and the second difference.

Alternatively, a measurement method includes a first step of capturing an image of a circuit pattern of a surface of an inspection object using rays of light or an electron beam, a second step of extracting a first pattern and a second pattern from the image captured in the first step, a third step of synthesizing a first reference image using the first pattern extracted from a plurality of the images and synthesizing a second reference image using the second pattern extracted from the plurality of images, a fourth step of quantifying a first difference that is a difference between the first reference image and the first pattern and a second difference that is a difference between the second reference image and the second pattern, and a fifth step of calculating an offset amount included in the circuit pattern using the first difference and the second difference.

Advantageous Effects of Invention

According to the present invention, it is possible to calculate an overlay even in a process initial step in an overlay measurement method and device in a product circuit using a reference image.

Details of the problem, the configuration, and the advantageous effects described above, and other problems, configurations, and advantageous effects will be apparent from the description of the following embodiments.

BRIEF DESCRIPTION OF DRAWINGS

FIG. 1 is a configuration diagram of an overlay measurement device.

FIG. 2 is a perspective view of a semiconductor device to be measured.

FIG. 3 is a captured image example of a device in which deviation is not present.

FIG. 4 is a captured image example of a device in which deviation is present.

FIG. 5 is an overall flowchart of an operation of an overlay measurement device.

FIG. 6 is a flowchart of an overlay calculation.

FIG. 7 is a flowchart of a generation of reference data.

FIG. 8 is a diagram illustrating an example of a processed image.

FIG. 9 is an operation screen example for generating the reference image.

FIG. 10 is an image example of an upper layer reference image.

FIG. 11 is an image example of a lower layer reference image.

FIG. 12 is an image example of the reference data.

FIG. 13 is an example of an upper layer cursor superimposed and displayed on the upper layer reference image.

FIG. 14 is an example of a lower layer cursor superimposed and displayed on the lower layer reference image.

FIG. 15 is a diagram illustrating a state in which the center of the upper layer cursor and the center of the lower layer cursor match with each other.

FIG. 16 is a display example in which the position of the upper layer cursor is fixed and displayed on the upper layer reference image.

FIG. 17 is a display example in which the position of the lower layer cursor is fixed and displayed on the lower layer reference image.

FIG. 18 is a display example in which the position of the upper layer reference image and the position of the lower layer reference image including the cursor are adjusted and displayed.

FIG. 19 is a screen example of a reference image update operation screen.

FIG. 20 is a diagram illustrating details of an image processing unit 110.

DESCRIPTION OF EMBODIMENTS

Embodiment 1

Hereinafter, an image automatic classification device according to the present invention will be described. In the present embodiment, a case where an overlay measurement is performed using an image captured by an imaging device including a Scanning Electron Microscope (SEM). However, the imaging device according to the present invention may be other than the SEM and may be an imaging device using charged particle beam such as an ion.

FIG. 1 illustrates an overall configuration diagram of an overlay measurement device according to the present invention. A scanning electron microscope device 100 according to the present embodiment configured of a stage 106 on which a wafer 107 is mounted, an irradiation optical system that controls an electron beam 101 emitted from an electron gun 102, a detector 108 that detects a secondary electron emitted from a sample, and a signal processing system of a detection signal. The irradiation optical system is configured of the electron gun 102, and a condenser lens 103, a deflection coil 104, and an objective lens 105 on a path of the electron beam 101. The electron beam 101 is concentrated in a predetermined region of an overlay measurement object on the wafer 107 by an optical system thereof.

A secondary electron detected by the detector 108 is converted into a digital signal by an A/D converter 109. The converted digital signal is transmitted to an image processing unit 110. The image processing unit 110 acquires the digital signal stored in a memory as necessary, performs image processing, and performs measurement processing and the like. A reference numeral 111 denotes a stage controller, a reference numeral 112 denotes an electron optical system control unit, a reference numeral 113 denotes a control unit of the entire device, and a reference numeral 114 denotes a display terminal for input and output connected to the control unit and also performs a display of a measurement result and the like.

A recording medium (not shown) may be connected to the image processing unit 110 to the entire control unit 113 to the control terminal 114, a program to be executed by the image processing unit 110 may be read out from the recording medium and may be loaded into the image processing unit 110. The A/D converter 109, the image processing unit 110, and the entire control unit 113 are connected with each other by a bus or a network denoted by a reference numeral 115. In the present embodiment, processing is performed on an image captured by an electron microscope, but the present invention may also be similarly applied to an image optically captured by an optical microscope or the like.

In the following description, an example of a device pattern to be measured will be described with reference to FIG. 2, and an example the captured image will be described with reference to FIGS. 3 and 4. FIG. 2 is an overhead view of the device pattern and illustrates a state in which a lower layer pattern 201 that is a first pattern and an upper layer pattern 202 that is a second pattern are formed on a substrate material 200. The patterns 201 and 202 are formed by different lithography processes.

FIG. 2 shows a state in which the patterns 201 and 202 are formed in different layers. However, even patterns formed on the same layer may be objects of the overlay measurement as long as deviation included in the mutual patterns occurs. In this case, the first pattern and the second pattern are defined as patterns formed by the different lithography processes.

FIGS. 3 and 4 are examples of the captured image of the pattern shown in FIG. 2. FIG. 3 is an example of an image in a state in which the pattern 202 of the upper layer is formed without deviation with respect to the pattern 201 of the lower layer, and FIG. 4 is an example of an image in a state in which deviation occurs between the pattern 201 of the lower layer and the pattern 202 of the upper layer.

FIG. 5 illustrates an overall flowchart at the time of the measurement. First, a wafer that is an observation object is loaded on the stage 106 of the scanning electron microscope device 100 shown in FIG. 1 (S500). Next, measurement position coordinate data configured of a measurement point number N is read via an external input/output I/F (not shown) of the entire control unit 113 (S501). Similarly, reference data is read (S502).

The reference data is configured of an upper layer reference image, a lower layer reference image, and an offset between both images, or is data obtained by synthesizing the upper layer reference image and the lower layer reference image into one sheet of reference image, using the offset between the both images. However, details are described with reference to FIG. 7 or below. Next, an alignment of the wafer is performed (S503). This is for associating wafer coordinates and stage coordinates by the coordinates of the wafer using a positioning mask on the wafer, so that a measurement point that is a target comes to a center of a field or view, when moving the stage 106 based on the position of the measurement position coordinates described by the coordinates on the wafer.

Thereafter, a series of procedures shown in S505 to S508 are repeated for all measurement points, and the overlay measurement is performed. First, the stage is moved to an nth measurement point position (S505). Although not shown in the drawing, after the stage is moved to the vicinity of the measurement point and detailed coordinate correction is performed, the field of view of the measurement point may be performed by a beam movement.

Next, the measurement pattern is imaged at the measurement point (S506), and the overlay measurement processing is performed (S507). Although S507 will be described in detail with reference to FIG. 6, circuit pattern recognition processing (S601) and image difference quantification processing (S602, S603) executed in S507 are executed by each processing unit 2001 to 2004 in the image processing unit 110 of FIG. 1.

The stage movement to a next measurement point may be executed without waiting for an end of the overlay measurement processing (S507). In a case where the measurement processing is ended within the time of the stage movement to the next measurement point, the measurement processing is performed during the movement. In a case where the measurement processing is not able to be ended within the time of the stage movement to the next measurement point, the captured images may be sequentially processed, or the captured image may be temporarily stored and batch processing may be performed by a separate offline. In a case where there is the next measurement point, the movement to the next measurement point is performed, and S505 to S508 are repeated. In a case where an acquisition of all defect observation images are ended, the wafer is unloaded from the stage 106 and the process is ended.

FIG. 6 illustrates a flow of an overlay calculation. A reference numeral 6a is the example of the measurement image captured in S506 of FIG. 5. First, the pattern recognition unit 2001 performs circuit pattern recognition processing of the measurement image 6a (S601) and obtains an upper layer measurement image (6d) and a lower layer measurement image (6f). The upper layer measurement image (6d) obtained as a result of the circuit pattern recognition processing is obtained by extracting an upper layer portion of the measurement image, and the lower layer measurement image (6f) is obtained by excluding the upper layer portion of the measurement image. The upper layer image and the lower layer image obtained as a result of the circuit pattern recognition processing thereafter also have similar properties. Reference data 6b is configured of an upper layer reference image (6c) and a lower layer reference image (6e) to be compared with the measurement image, and an offset (offset_x between images, offset_y between images).

The reference data 6b is generated in advance before the measurement and is read in S502 of FIG. 5. A method of generating the reference data performed by the reference image generation unit 2002 will be described with reference to FIG. 7.

Next, the quantification unit 2003 quantifies a difference between the upper layer pattern image 6d of the measurement image and the upper layer reference image 6c (S602), and obtains an upper layer pattern position deviation amount ($\Delta Ux$, $\Delta Uy$) (6g). Similarly, a difference between the lower layer pattern image 6f of the measurement image and the lower layer reference image 6e is quantified (S603), and a lower layer pattern position deviation amount ($\Delta Lx$, $\Delta Ly$) (6h) is obtained.

As a quantification method of the difference, a method of calculating a correlation value while shifting the position where two images are superimposed and setting a position having the maximum correlation value as the position deviation amount is considered. That is, a method of adjusting a position of the other with respect to one of the two images and setting a movement amount of the other image obtained at this time as the position deviation amount. An overlay amount ($\Delta x$, $\Delta y$) is calculated using the obtained upper layer pattern position deviation amount, the lower layer pattern position deviation amount, and the offset of the upper layer and lower layer images of the reference data (6b) (offset_x between images, offset_y between images) (S604). In a case of synthesizing one sheet of reference image using the offset of the upper layer reference image and the lower layer reference image, the circuit pattern recognition may be performed on the reference image included in the reference data that is read at the time of the overlay measurement, and the upper layer reference image (6c) and the lower layer reference image (6e) may be generated.

The overlay amount calculation (S604) is performed by the calculation unit 2004. A storage unit 2005 in FIG. 20 stores image data and numerical data input and output for processing by each of the processing units 2001, 2002, 2003, and 2004. An input/output I/F shown in by a reference numeral 2006 inputs the image data from the A/D converter 109, receives various processing commands from the entire control unit 113, outputs a processing result to the entire control unit 113, and outputs information to be displayed on the display terminal 114. A bus 2007 connects each processing unit in the image processing unit 100 and enables each processing unit to transmit and receive information mutually.

A method of generating the reference data will be described with reference to FIG. 7. An image is captured at N places (S700). The captured place is a place captured at the time of the overlay measurement. S700 may be executed except for S502 and S507 of the flow shown in FIG. 5. The wafer to be captured may be the same as or different from the wafer to be measured. An image (m) that is a temporary reference image is selected from the captured N sheets of images (S701). The m is the selected image number from 1 to N.

In the selection of the image (m), an operator selects an image determined to be relatively appropriate for a position adjustment processing result in S706 and S709 that will be described later, such as a contrast of the pattern, a positional relationship of the upper layer and the lower layer. Instead of selecting the image (m), plural sheets of images may be selected from N sheets of images and an addition average image thereof may be used instead of the image (m). The temporary reference image is a reference image temporarily used when performing the position adjustment in the following S706 and S709 and is different from a finally obtained image for each pattern or a reference image obtained by integrating them.

It is expected that an S/N of the image is improved and the position adjustment processing in S706 and S709 is stabilized by the addition average. In a case of performing the average addition of the plural sheets, a portion of the image (m) is read as the average addition image. A circuit pattern of the image (m) is performed to generate an upper layer image (m), a lower layer image (m), an upper layer binary image (m), and a lower layer binary image (m) (S702). The upper layer binary image is an image in which only the upper layer pattern has a pixel value of non-zero. The lower layer binary image is an image in which a portion other than the upper layer pattern has a pixel value of non-zero. In S703, pixel values of the upper layer reference image, the lower layer reference image, an upper layer count image, and a lower layer count image are cleared to zero. Subsequently, the image n (n=1, . . . , and N) is processed from S705 to S711.

The circuit pattern recognition is performed on an image (n), and an upper layer image (n) and a lower layer image (n) are generated (S705). A position of the upper layer image (n) is adjusted to the upper layer reference image (m) (S706), and the upper layer image (n) after the position adjustment is added to the upper layer reference image (S707). In addition, one is added to the pixel value of the upper layer count image corresponding to a pixel to be added in the upper layer reference image (S708). The pixel to be added is a pixel having a pixel value of non-zero. A pixel of which a pixel value is zero as a result of extraction for each layer does not become the addition object. For example, in the upper layer measurement image (6d), a portion drawn in white is a pixel to be added.

The upper layer image (n) is set to IU(n), the upper layer reference image (m) is set to IU(m)(x, y), the upper layer reference image is set to RU(x, y), and the upper layer count image is set to CU(x, y). The x and y are coordinate values indicating the position of the image. In a case where the position deviation between the upper layer image (n) and the upper layer reference image (m) obtained as a result of the position adjustment of the upper layer image (n) and the upper layer reference image (m) is set to ($\Delta x$, $\Delta y$), it is expressed as follows.

[Math. 1]

$$IU(m)(x,y) \leftarrow IU(m)(x+\Delta x, y+\Delta y) \quad \text{formula (1)}$$

The addition of the upper layer image (n) after the position adjustment to the upper layer reference image (S707) is expressed as follows.

[Math. 2]

$$RU(x,y) \leftarrow RU(x,y) + IU(n)(x+\Delta x, y+\Delta y) \quad \text{formula (2),}$$

and adding one to the pixel value of the upper layer count image corresponding to the pixel to be added in the upper layer reference image (S708) is expressed as follows.

[Math. 3]

$$CU(x,y) \leftarrow CU(x,y) + 1 \quad \text{formula (3).}$$

Similarly for the lower image, a position of the lower layer image (n) is adjusted to the lower layer reference image (m) (S709), and the lower layer image (n) after the position adjustment is added to the lower layer reference image (S710). In addition, one is added to the pixel value of the lower layer count image corresponding to a pixel to be added in the lower layer reference image (S711). The pixel to be added is a pixel having a pixel value of non-zero.

As described above, after the processes of S705 to S711 is completed for the image n (n=1, . . . , and N), the pixel value of the upper layer reference image is divided by the corresponding pixel value of the upper layer count image, and a standardization of the pixel value of the upper layer reference image is tried. This process is performed at a pixel (x, y) of CU(x, y)≠0, and the formula thereof is expressed as follows.

[Math. 4]

$$RU(x,y) \leftarrow RU(x,y)/CU(x,y) \quad \text{formula (4).}$$

In a case where the CU(x, y) is 0, the RU(x, y) is also 0. Similarly for the lower layer reference image, the pixel value of the lower layer reference image is divided by the corresponding pixel value of the lower layer count image (S714).

As described above, it is possible to increase a weight of the pixel that fills a loss portion by the division by the CU(x, y) that means the number of times of the additions while adding the pixel to be added. Inversely, since the pixel added several times is not missing portion, a weight is reduced by the division of the number of times of the addition. Therefore, it is possible to generate a reference image in which a loss portion is effectively compensated by even a small number of sheets.

As described above, as a method of obtaining the upper layer reference image and the lower layer reference image by synthesizing plural images, a method by the addition average is shown, but the synthesizing method is not limited to this method.

Finally, after generating the upper layer reference image and the lower layer reference image, the deviation amount between the patterns of the both images is acquired as an offset (S715). A method of acquiring the offset is described with reference to FIG. 9.

The image processed according to the flow shown in FIG. 7 is schematically shown in FIG. 8. The captured image is shown in a first stage. A reference numeral 800 is a selected image (m). As an example of four images, an image (n1), an image (n2), an image (n3), and an image (n4) with different positions and sizes of the upper layer patterns are listed by reference numerals 801 to 804. The lower layer is set to be the same as the image (m) for convenience of the description. An example of the upper layer image obtained by the circuit pattern recognition for an original image of the first stage is shown in a second stage. An upper layer image (m) is denoted by a reference numeral 805, and an upper layer image (n1), an upper layer image (n2), an upper layer image (n3), and an upper layer image (n4) corresponding to the image (n1), the image (n2), the image (n3), and the image (n4) are denoted by reference numerals 806 to 809. In a third stage, outlines of the reference numerals 805 to 809 are drawn, and each of positions of upper layer patterns of the upper layer image (n1) 806, the upper layer image (n2) 807, the upper layer image (n3) 808, and the upper layer image (n4) 809 are adjusted to the upper layer pattern of the upper layer image (m) 805. This is a schematic representation of a portion corresponding to S706 in FIG. 7. After the position adjustment of the reference numerals 805 to 809, the addition average processing shown in formula (2), formula (3), and formula (4) is performed to obtain the upper layer reference image.

The upper layer reference image obtained in this method may expect an effect that an image S/N by an average arithmetic calculation is improved, and a shape, brightness, or the like of a pattern in a specific image is not biased, as compared with the upper layer reference image obtained from one sheet of image.

An example of the lower layer image obtained by the circuit pattern recognition for the original image of the first stage is shown in a fourth stage. A lower layer image (m) is denoted by a reference numeral 810, and a lower layer image (n1), a lower layer image (n2), a lower layer image (n3), and a lower layer image (n4) corresponding to the image (n1), the image (n2), the image (n3), and the image (n4) are denoted by reference numerals 811 to 814. Since a pixel of an upper layer pattern portion is extracted, a lower layer image in which an upper layer pattern portion is defective is obtained as denoted by the reference numerals 810 to 814.

Images 815 to 818 of a fifth stage is obtained by drawing outlines of the lower layer patterns of the images 811 to 814, and the image 816 is obtained by superimposing the images 815 to 818. A defective portion corresponding to each image is positioned at four places of the image. For example, the reference numeral 815 is a portion corresponding to the upper layer pattern portion 815 of the lower layer image (n+4) shown in the image 814. However, a portion corresponding to the reference numeral 815 of the image (n1), the image (n2), and the image (n3) 811 to 813 is an effective pixel portion in which the lower layer pattern is captured. Therefore, in the lower layer reference image 817 obtained by the addition average of the reference numerals 811 to 814, the portion corresponding to the region 815 is compensated by image data of the reference numerals 811 to 813, and defect is not remained. The same applied to a defective portion of the image 811 to the image 813.

For convenience of the description, the position of the lower layer pattern in the image is the same between the image 800 and the image 801 to the image 804, but although the positions are different from each other, in a case where each of the positions of the image 800 and the image 801 to the image 804 are adjusted as shown in S709, it is possible to obtain the same effect.

In a case where superimposing occurs in the defective portion of the image 801 to the image 804, a portion without the effective pixel occurs although any image is brought from the image 801 to the image 804. However, only the lower layer image such as the image 810 is obtained by one sheet of image. On the other hand, in a case where plural images are used, it can be expected to obtain an image with less defects. For example, in a case where the difference quantification processing of S603 in FIG. 6 is performed by a correlation calculation, when the calculation is performed by ignoring the remaining defective portion, it is possible to calculate using more effective pixels compared with the method of the related art. Therefore, it is possible to stably calculate a correlation value, thereby improving stability and reproducibility of the overlay calculation result. In addition, similarly to the upper layer pattern the generated lower layer reference image may expect an effect that S/N is superior, and a shape, brightness, or the like of a pattern in a specific image is not biased.

A reference numeral 900 in FIG. 9 is an operation screen for generating a reference image 1200 and is a display content of the display terminal 114 in FIG. 1. The operator instructs the execution of the flow shown in FIG. 7 by this screen.

First, an operation related to the selection of the image (m) of S701 in FIG. 7, that is, the temporary reference image will be described. A reference numeral 901 denotes a selection window of the temporary reference image. An image file name displayed in a list box 902 is an image file used in generating the reference image. The operator instructs the temporary reference image from the image file in the list box 902. The instructed image is displayed on the image display window 907, by clicking the file name in the list box 902.

An image file name outside the list box 902 may be displayed using a slider bar next to the list box 902. Alternatively, a pointer may be placed in the list box 902 may the image file name outside the list box 902 may be displayed by a mouse wheel or the like of a computer. The shown list box 902 indicates a state in which an image file name "ID0057" is selected. In this state, the instructed image is selected and moved to a selection screen list 903 by clicking "OK" of a reference numeral 904.

In the selection image list box 903, the file name of the image selected as the temporary reference image is displayed. The selected temporary reference image is displayed on the image display window 907 by clicking the file name in the selection image list box 903. In a case of cancelling the selection, the selection may be canceled and an object screen may be returned to the list box 902 by clicking the file name in the selection image list box 903 and clicking a "return" button of a reference numeral 906.

S702 to S714 of FIG. 7 are executed by clicking an execution button of a reference image generation window 908, and the upper layer reference image and the lower layer reference image are generated. In a case where an image that is not appropriate for the reference image generation is included, before the reference image generation is executed, the image file is instructed in the list box 902 and a "delete" 905 is clicked to remove the image that is not appropriate for the reference image generation from the object of the image used in the reference image generation.

An operation related to S715 in FIG. 7 and an offset acquisition of the upper layer reference image and the lower layer reference image will be described. A reference numeral 909 is an offset adjustment window. In a case where an "upper layer reference image" button 910 is clicked, the generated lower layer reference image is displayed on an image window 907 and a sub-image window 916. The sub-image window 916 enlarges and displays a portion of the image displayed on the reference numeral 907. In a case where a "lower layer reference image" button 911 is clicked, the generated upper layer reference image is displayed on the image window 907 and the sub-image window 916. The "upper layer reference image" button 910, the "lower layer reference image" button 911, a "cursor setting" button 912, an "offset setting" button 913, an "OK" button 914, and a movement key 915 will be described with reference to FIGS. 10 to 18 together with an image displayed on the sub-image window 916.

A reference numeral 1000 of FIG. 10 is the upper layer reference image, and a reference numeral 1100 of FIG. 11 is the lower layer reference image. A cursor 1300 of FIG. 13 is an example of a cursor for a display superimposed on the upper layer reference image, and a center position is denoted as a reference numeral 1301. A cursor 1400 of FIG. 14 is an example of a cursor for a display superimposed on the lower layer reference image, and a center position is denoted as a reference numeral 1401.

The upper layer reference image is displayed on the sub-image window 916 by the "upper layer reference image" button 910, and the cursor is superimposed on the upper layer reference image and displayed by the "cursor setting" button 912. Since the center of the upper layer pattern of the upper layer reference image does not match with the center 1301 of an upper layer cursor at an initial stage, the operator moves the upper layer cursor 1300 superimposed and displayed on the upper layer reference image using the movement key 915 so that the center of the upper layer pattern and the center 1301 of the upper layer cursor match with each other. In a case where the center of the upper layer pattern and the center 1301 of the upper layer cursor match with each other, the "OK" button 914 is clicked, and a positional relationship between the upper layer reference image and the upper layer cursor is fixed. The same is also applied to the lower layer reference image.

In a case where it is possible to obtain the pattern center by image processing or the like, a result obtained by the image processing is displayed as an initial position, and the operator may check the result by clicking the "OK" button 914.

A result of fixing the positional relationship between the upper layer reference image and the upper layer cursor, and between the lower layer reference image and the lower layer cursor is shown in FIGS. 16 and 17. In FIGS. 16 and 17, for easy viewing, the patterns included in the upper layer reference image and the lower layer reference image are drawn by broken lines. An image in which the upper layer reference image is superimposed on the lower layer reference image and the upper layer cursor and the lower layer cursor are further superimposed thereon is displayed on the sub-image window 916 by the "offset setting" button 913. The positional relationships of the upper layer cursor and the lower layer cursor with respect to the upper layer reference image and the lower layer reference image are fixed, respectively. At this time, a movement amount of the upper layer reference image with respect to the lower layer reference image is (Δx, Δy)=(0, 0). Subsequently, the upper layer reference image is moved relative to the lower layer reference image by the movement key 915 (note that the upper layer cursor also similarly moves with respect to the lower layer cursor).

As the operator moves the upper layer reference image by the movement key 915, the operator moves the upper layer and lower layer cursors until the centers of the upper layer and lower layer cursors match with each other as shown in FIG. 15. FIG. 18 illustrates a state in which the deviation between the upper layer reference image and the lower layer reference image is resolved as a result of moving the upper layer image by (Δx, Δy)=(ΔX, ΔY). In this state, the "OK" button 914 is clicked (ΔX, ΔY), and the offset value of the upper layer reference image and the lower layer reference image is registered as reference data together with the upper layer reference image and the lower layer reference image. A fixed position of the cursor may be registered in the reference data. The registered offset value is used in the overlay calculation in S604 of the overlay measurement processing (FIG. 6).

In addition, as the image used in the overlay calculation, an image of a state in which the deviation between the upper layer reference image and the lower layer reference image is resolved, that is, an image 1200 shown in FIG. 12 may be registered as the reference data. In this case, in the overlay measurement processing (FIG. 6), the circuit pattern recognition may be performed on the reference image included in the read reference data to generate the upper layer reference image (6c) and the lower layer reference image (6e). The offset (0, 0) may be recorded in the reference data. The fixed position of the cursor may be registered in the reference data.

A reference image update operation screen 1900 of FIG. 19 is a screen example of a transition destination to which a transition is performed by clicking a "registration data use" button 917. A reference numeral 1901 is a newly generated upper layer reference image, and a reference numeral 1902 is a newly generated lower layer reference image. A reference numeral 1903 is a window that displays registered reference data generated in the past, and a reference numeral 1904 is a list box of the registered reference data.

In a case where the registered reference data is selected from the list of the reference numeral 1904 and the registered reference data is checked by clicking an OK button in the reference numeral 1903, the upper layer reference image 1905 and the lower layer reference image 1906 recorded in the registered reference data are displayed. On an image window 1915, an image in which the new upper layer reference image 1901 and the upper layer reference image 1905 that is registered in the past overlap is displayed, and on an image window 1916, an image in which the new lower layer reference image 1902 and the lower layer reference image 1906 that is registered in the past overlap is displayed.

In a method of an overlap display 1910, an "image" and a "cursor" are considered. In a case where the "image" of the overlap display 1910 is clicked and selected, a gray value of one image is caused to correspond to a pixel value of a specific color, a gray value of the other image is caused to correspond to a pixel value of another specific color, the images are caused to overlap each other, and the images are displayed on the image windows 1915 and 1916.

In a case where the "cursor" of the overlap display 1910 is clicked and selected, only cursors registered for each image are displayed and overlapped. A position of the newly generated upper layer reference image 1901 is adjusted to the upper layer reference image 1905 that is registered in the past and a position of the newly generated lower layer reference image 1902 is adjusted to the lower layer reference image 1906 that is registered in the past, by the upper layer reference image 1915 and the lower layer reference image 1916 that are overlapped each other and displayed. The position adjustment of the upper layer reference image is performed by clicking an upper layer reference image button 1908 and clicking a movement key 1912 to move the newly generated upper layer reference image 1901 upward, downward, leftward, and rightward with respect to the upper layer reference image 1905 that is registered in the past. A position adjustment of the lower layer reference image is also similar.

In a case the position adjustment is completed, an OK button 1913 is clicked, and an offset (OFFSET_X, OFFSET_Y) between the new reference image and the reference image that is registered in the past.

In the position adjustment between the newly generated upper layer reference image 1901 and the upper layer reference image 1905 that is registered in the past, an automatic position adjustment may be used in pattern matching processing using an image correlation calculation or the like. In this case, after clicking an upper layer reference image button 1908, an automatic adjustment button 1914 is clicked. An automatic position adjustment between the lower layer reference image 1902 and the lower layer reference image 1906 that is registered in the past is similarly executed. A process of the automatic position adjustment is performed by the quantification unit.

The method of calculating the overlay is as shown in S604 of FIG. 6. However, in a case where (offset_x, offset_y) shown in S604 is set as a registered offset, the overlay calculation after updating the reference data is expressed as follows.

[Math. 5]

$$\Delta x(\Delta Lx - \Delta Ux) + \text{offset\_}x + \text{OFFSET\_}X \qquad \text{formula (5)}$$

[Math. 6]

$$\Delta y(\Delta Ly - \Delta Uy) + \text{offset\_}y + \text{OFFSET\_}Y \qquad \text{formula (6).}$$

Therefore, a new offset (new_offset_x, new_offset_y) may be calculated by formulae (7) and (8) expressed as follows.

[Math. 7]

$$\text{new\_offset\_}x = \text{offset\_}x + \text{OFFSET\_}X \qquad \text{formula (7)}$$

[Math. 8]

$$\text{new\_offset\_}y = \text{offset\_}y + \text{OFFSET\_}Y \qquad \text{formula (8),}$$

and the new offset is registered as the offset.

Therefore, even though the new reference data is created at the time of a process change, since the new reference data is created using the past reference data, it is possible to maintain consistency with the offset of the past reference data. Therefore, even in a case where the reference data is created again according to the process change or the like, there is an effect that the consistency of the measurement value is maintained by correcting the offset of the reference data that is acquired in the past.

In consideration of the above, the measurement device described in the present embodiment includes an imaging unit 100 that captures an image of a circuit pattern of a surface of an inspection object 200 by an optical microscope or an electronic microscope, a pattern recognition unit 2001 that extracts a first pattern 6d and a second pattern 6f from the image captured by the imaging unit 100, a reference image generation unit 2002 that synthesizes a first reference image using the first pattern 6d extracted from plural the images and synthesizes a second reference image using the second pattern 6f extracted from the plural images, a quantification unit 2003 that quantifies a first difference that is a difference between the first reference image and the first pattern 6d and a second difference that is a difference between the second reference image and the second pattern 6f, and a calculation unit 2004 that calculates an overlay amount included in the circuit pattern using the first difference and the second difference.

In addition, a measurement method described in the present embodiment includes a first step (S506) of capturing an image of a circuit pattern of a surface of an inspection object using rays of light or an electron beam, a second step (S601) of extracting a first pattern 6d and a second pattern 6f from the image captured in the first step, a third step (S700 to S715) of synthesizing a first reference image using the first pattern 6d extracted from plural the images and synthesizing a second reference image using the second pattern 6f extracted from the plural images, a fourth step (S602 and S603) of quantifying a first difference that is a difference between the first reference image and the first pattern 6d and a second difference that is a difference between the second reference image and the second pattern 6f, and a fifth step (S604) of calculating an overlay amount included in the circuit pattern using the first difference and the second difference.

It is possible to acquire the reference image for each layer and it is possible to acquire the offset amounts of these, by separating the circuit pattern into the first pattern 6d and the second pattern 6f and synthesizing the reference image from the plural sheets of images with each pattern as described above. In a case where the deviation amount between the upper layer reference image and the lower layer reference image is known, it is possible to calculate the overlay using the upper layer reference image, the lower layer reference image, and the offset amount even in the process initial stage.

In addition, a display device 114 described in the present embodiment includes a first display area 907 that displays a circuit pattern image of a surface of a measurement object 200, a second display area 916 that displays a first pattern image or a second pattern image extracted from the circuit pattern image or a superimposed image obtained by superimposing the first pattern on the second pattern, and a setting area 909 that displays input unit for inputting a relative position of the first pattern and the second pattern displayed in a superimposing display area.

It is possible to provide a screen for the user to conveniently calculate the offset amount between the upper layer reference image and the lower layer reference image by displaying the adjustment of the relative position between the first pattern and the second pattern as described above.

REFERENCE SIGNS LIST

100: scanning electron microscope device
101: electron beam
102: electron gun
103: condenser lens
104: deflection coil
105: objective lens
106: stage
107: wafer
108: detector
109: A/D converter
110: image processing unit
111: stage controller
112: electron optical system control unit
113: entire control unit
114: display terminal
200: substrate material
201: lower layer pattern
202: upper layer pattern
900: reference image generation operation screen
1900: reference image update operation screen

The invention claimed is:

1. A measurement device comprising:
an imaging device configured to capture an image of a circuit pattern of a surface of an inspection object by an optical microscope or an electronic microscope;
an image processor configured to perform
pattern recognition including extracting a first pattern and a second pattern from the image captured by the imaging device;
reference image generation including synthesizing a first reference image using the first pattern extracted from a plurality of images corresponding to the captured image of the circuit pattern of the surface of the inspection object and synthesizing a second reference image using the second pattern extracted from the plurality of images corresponding to the captured image of the circuit pattern of the surface of the inspection object, wherein said reference image generation excludes any reference image data obtained prior to said first and second reference images;
difference quantification by quantifying a first difference that is a difference between the first reference image and the first pattern and a second difference that is a difference between the second reference image and the second pattern; and
calculation of an overlay amount included in the circuit pattern using the first difference and the second difference.

2. The measurement device according to claim 1, wherein the image processor is further configured to perform offset adjustment by adjusting a relative position between the first reference image and the second reference image.

3. The measurement device according to claim 1, further comprising:
a storage device that stores the first reference image and the second reference image generated in the past as a past first reference image and a past second reference image, wherein
the image processor performs quantification of a position adjustment between the newly generated first reference image and the past first reference image and performs a position adjustment between the newly generated second reference image and the past second reference image.

4. The measurement device according to claim 3, wherein the image processor updates and stores an offset amount of the past first reference image and the past second reference image, using a third difference that is a difference between the first reference image and the past first reference image and a fourth difference that is a difference between the second reference image and the past second reference image.

5. The measurement device according to claim 1, wherein the image processor further performs reference image generation which synthesizes the first reference image and the second reference image by selecting one sheet of image from a plurality of sheets of the images as a temporary reference image and adding a pattern extracted from the image to a pattern extracted from the temporary reference image.

6. The measurement device according to claim 1, wherein the inspection object used in the reference image generation and the inspection object used in the quantification are different from each other.

7. A measurement method comprising:
a first step of capturing an image of a circuit pattern of a surface of an inspection object using rays of light or an electron beam;
a second step of extracting a first pattern and a second pattern from the image captured in the first step;
a third step of synthesizing a first reference image using the first pattern extracted from a plurality of images corresponding to the captured image of the circuit pattern of the surface of the inspection object and synthesizing a second reference image using the second pattern extracted from the plurality of images corresponding to the captured image of the circuit pattern of the surface of the inspection object, wherein said reference image generation excludes any reference image data obtained prior to said first step;
a fourth step of quantifying a first difference that is a difference between the first reference image and the first pattern and a second difference that is a difference between the second reference image and the second pattern; and
a fifth step of calculating an overlay amount included in the circuit pattern using the first difference and the second difference.

8. The measurement method according to claim 7, further comprising:
an offset adjustment step of adjusting a relative position between the first reference image and the second reference image.

9. The measurement method according to claim 7, further comprising:
a sixth step of storing the first reference image and the second reference image generated in the past as a past first reference image and a past second reference image; and
a seventh step of performing a position adjustment between the newly generated first reference image and the past first reference image and performing a position adjustment between the newly generated second reference image and the past second reference image.

10. The measurement method according to claim 9, wherein
in the seventh step, an offset amount of the past first reference image and the past second reference image is updated and stored, using a third difference that is a difference between the first reference image and the past first reference image and a fourth difference that is a difference between the second reference image and the past second reference image.

11. The measurement method according to claim 7, wherein
the inspection object used in the third step and the inspection object used in the fourth step are different from each other.

12. The measurement method according to claim 7, wherein
in the third step, the first reference image and the second reference image are synthesized, by selecting one sheet of image from a plurality of sheets of the images as a temporary reference image and adding a pattern extracted from the image to a pattern extracted from the temporary reference image.

13. The measurement method according to claim 8, wherein the offset adjustment step further comprises assigning an increased pixel weight to a pixel corresponding to a loss portion of one of said first and second extracted patterns by dividing each pixel weight for each pixel associated with said first or second extracted pattern by a number of times a non-zero pixel value occurs for said pixel in said plurality of images of the captured image, so that a pixel weight associated with said loss portion has a higher value than a pixel weight associated with another portion of said first of second extracted pattern.

14. The measurement device according to claim 2, wherein the image processor is further configured to perform offset adjustment by assigning an increased pixel weight to a pixel corresponding to a loss portion of one of said first and second extracted patterns by dividing each pixel weight for each pixel associated with said first or second extracted pattern by a number of times a non-zero pixel value occurs for said pixel in said plurality of images of the captured image, so that a pixel weight associated with said loss portion has a higher value than a pixel weight associated with another portion of said first of second extracted pattern.

* * * * *